(12) United States Patent
Levi

(10) Patent No.: US 6,510,547 B1
(45) Date of Patent: Jan. 21, 2003

(54) METHOD AND APPARATUS FOR EVOLVING AN OBJECT USING SIMULATED ANNEALING AND GENETIC PROCESSING TECHNIQUES

(75) Inventor: Delon Levi, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 188 days.

(21) Appl. No.: 09/694,449

(22) Filed: Oct. 20, 2000

(51) Int. Cl.$^7$ .............. G06F 17/50; G06F 15/16; G06F 19/00; G06N 3/00; G06T 15/00
(52) U.S. Cl. .............. 716/16; 709/203; 706/13; 700/103; 345/419
(58) Field of Search .......................................... 716/16

(56) References Cited

U.S. PATENT DOCUMENTS

| | | | | |
|---|---|---|---|---|
| 5,511,158 A | * | 4/1996 | Sims | 345/419 |
| 5,761,484 A | * | 6/1998 | Agarwal et al. | 716/16 |
| 5,897,628 A | * | 4/1999 | Kitano | 706/13 |
| 6,185,724 B1 | * | 2/2001 | Ochotta | 716/16 |
| 6,233,493 B1 | * | 5/2001 | Cherneff et al. | 700/103 |
| 6,363,368 B2 | * | 3/2002 | Shinagawa | 706/13 |
| 6,363,519 B1 | * | 3/2002 | Levi et al. | 709/203 |
| 6,378,122 B1 | * | 4/2002 | Levi et al. | 716/16 |
| 2001/0011258 A1 | * | 8/2001 | Shinagawa | 706/13 |
| 2001/0018762 A1 | * | 8/2001 | Lenzie | 716/16 |

OTHER PUBLICATIONS

Adrian Thompson, "Silicon Evolution", Proceedings of Genetic Programming 1996 (GP96), J.R. Koza et al., (Eds.), pp. 444–452. MIT Press 1996.

\* cited by examiner

*Primary Examiner*—Matthew Smith
*Assistant Examiner*—Andrea Liu
(74) *Attorney, Agent, or Firm*—LeRoy D. Maunu; Crawford PLLC

(57) ABSTRACT

Method and apparatus for evolving an object using simulated annealing and genetic processing techniques. In various embodiments, simulated annealing and genetic processing techniques are combined to evolve a computer-represented object. In each iteration an object is mutated in proportion to a mutation level, and the mutated object is evaluated relative to satisfaction of predetermined criteria. The mutation level is reduced with each iteration as the object approaches a final solution. Poorer-performing objects are selectively mutated or discarded based on a probabilistic function. As the object approaches a final solution, the probability of keeping and mutating poorer-performing objects is reduced.

21 Claims, 3 Drawing Sheets

METHOD AND APPARATUS FOR EVOLVING AN OBJECT USING SIMULATED ANNEALING AND GENETIC PROCESSING TECHNIQUES

GOVERNMENT CONTRACT

The U.S. Government has a paid-up license in this invention and the right in limited circumstances to require the patent owner to license others on reasonable terms as provided for by the terms of DABT63-99-3-0004 awarded by DARPA.

FIELD OF THE INVENTION

The present invention generally relates to computer-implemented techniques for evolving a solution to a particular problem, and more particularly to a technique that is a hybrid of evolution-based processing techniques and simulated annealing techniques.

BACKGROUND

Many conventional design methodologies are generally based on a structured design approach. That is, high-level requirements are partitioned, perhaps hierarchically, into lower-level requirements. Teams of engineers are assigned to create designs and sub-designs that meet the requirements at the different levels. The structured design methodology is advantageous because it supports building on past experiences in addressing similar types of requirements, thereby promoting the development of an effective design in an efficient manner. However, a drawback to traditional design methods is that the same experiences that promote quickly satisfying a requirement may blind engineers to alternative, and perhaps better, solutions.

Work is presently underway to fundamentally change the way in which designs are created. The new methodology uses principles of natural selection from the biological world to find hardware and/or software designs. The process is often characterised as using "genetic algorithms" to find a solution. In an example process of evolving a design, a population of designs is first randomly created, tested, and scored based on the suitability to meet the design requirements. Then, based on natural selection principles, certain ones of the designs in the population are selected to "reproduce," that is, are used to create new designs for the population. The process of testing, scoring, and reproducing is then repeated until a suitable design has evolved.

At present, evolving circuits is very time consuming. Many hours or even days can be spent evolving a circuit, depending on the desired functionality of the circuit. Proposed solutions to accelerate the process of evolving a circuit include the use of super-computers, massive clusters of networked microcomputers working in parallel, and custom computers. While any or all of these solutions may reduce the time required to evolve a suitable circuit, each is expensive in terms of the required hardware.

A system and method that address the aforementioned problems, as well as other related problems, are therefore desirable.

SUMMARY OF THE INVENTION

In various embodiments, method and apparatus are provided for evolving an object using simulated annealing and genetic processing techniques. In each iteration a single object is mutated in proportion to a mutation level, and the mutated object is evaluated relative to the satisfaction of predetermined criteria. With each iteration, the mutation level is reduced if the present solution is better than the best solution thus far achieved. On each iteration, a poorer-performing object is either kept or its mutations are undone for future iterations based on a probabilistic function. As the object approaches a final solution, the probability of keeping and mutating poorer-performing objects is reduced.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings, in which.

DETAILED DESCRIPTION

Various embodiments of the present invention are described in terms of evolving a design in the form of a configuration bitstream for a programmable logic device. However, it will be appreciated that the techniques described herein could be applied to other problem domains. For example, the techniques could be applied to search and optimization problems in general. Therefore, the invention is not limited to the evolution of configuration bitstreams nor to evolving circuit designs. The term "object" is used herein to reference the computer representation of the evolving solution.

Evolution-based algorithms generally perform the steps of proposing an object, evaluating the object, deciding whether to keep the object for the next generation, and repeating the process until an object provides a suitable solution. A genetic algorithm uses various techniques, such as crossover or mutation, to propose new objects and survival of the fittest techniques to determine which objects survive to the next generation.

Simulated annealing, an optimization algorithm that is used in the electronics CAD industry for placement, shares some characteristics with genetic algorithms. An iterative process is performed in which a new object is proposed in each iteration through mutation and a better-performing object is saved for the next iteration. Unlike genetic algorithms, simulated annealing evolves a single object in each generation instead of a population of objects. Because simulated annealing only addresses one object, mutation is used to propose a new object. If the new object is a better match to the solution criteria than the parent object, the new object is used in generating the next new object. Otherwise, depending on a probabilistic function, the new object is either discarded or used and mutated in the next iteration. Keeping some of the poorer-performing objects provides a path to searching for more desirable solutions.

Simulated annealing is generally used where small changes in the object are desirable so that a child object is not substantially different from the parent object. For example, an object may undergo a 1-bit mutation in simulated annealing. In evolving an object for a complex problem, however, thousands, tens of thousands, or hundreds of thousands of bits may be required. Thus, a single bit mutation would not scale well for larger problems. In one embodiment of the invention, the mutation level is reduced from a high level to a low level while the object is evolving. The mutation level is the portion of the object that is mutated, for example, the number of bits. In another embodiment, the probability used to accept a poorer-performing mutation is scaled from a high-probability to a low probability as the evolving object converges on a solution.

Figure 1:
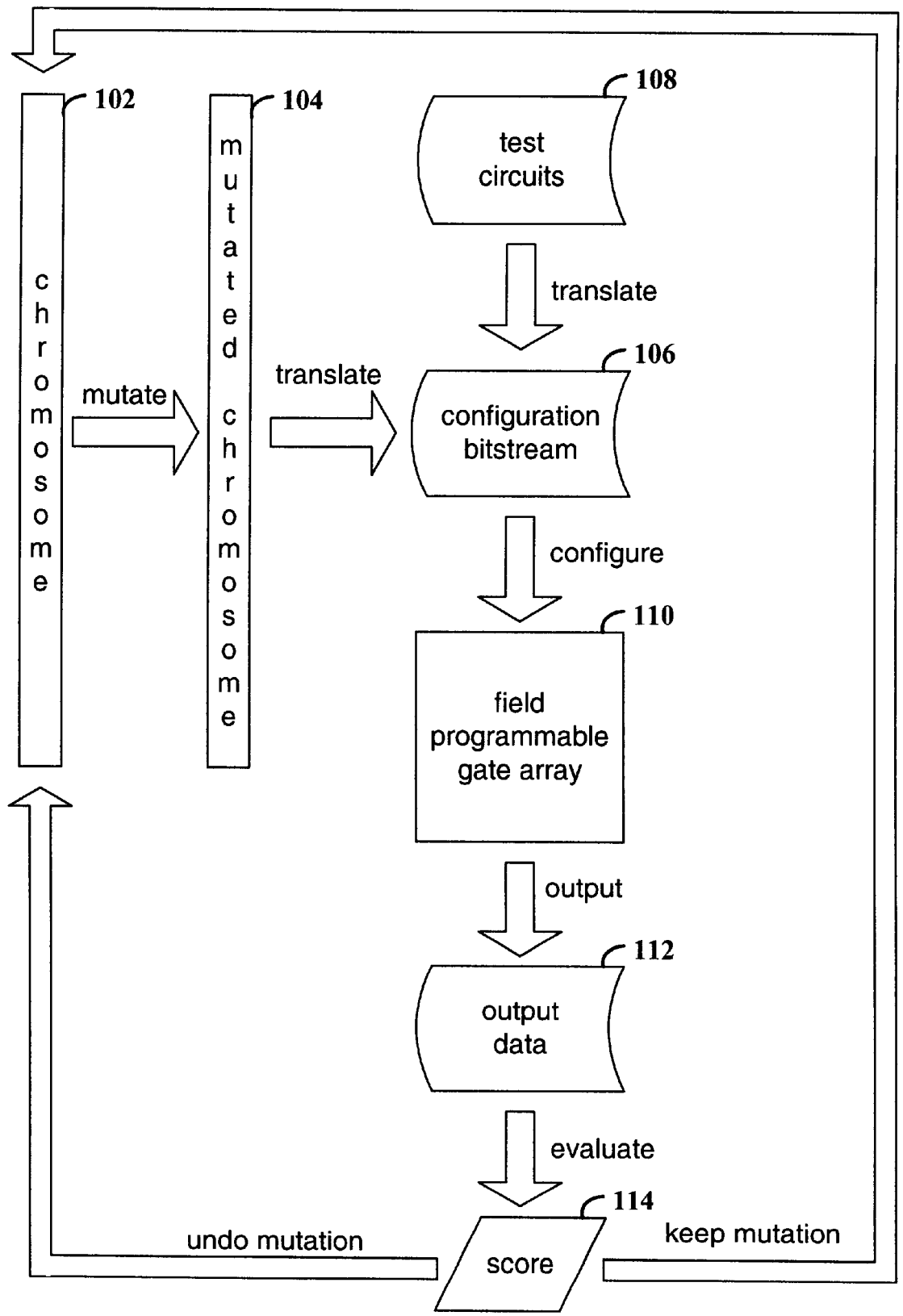
FIG. 1 is a data flow diagram that illustrates the evolution of an object in accordance with one embodiment of the invention.

FIG. 1 is a data flow diagram that illustrates the evolution of an object in accordance with one embodiment of the invention. The example involves the mutation of a chromosome 102 and the translation of the mutated chromosome 104 to a configuration bitstream 106. In the example embodiment, the translation of the mutated chromosome to configuration bitstream 106 is performed using the JBits software from Xilinx, Inc. Also using the JBits software, test circuits 108 are instantiated in bitstream 106 to drive test vectors to the evolved circuit and store output data. Instantiating test circuits in the configuration bitstream allows testing of the evolving circuitry without additional hardware to drive the circuit.

A field programmable gate array 110 is configured with the configuration bitstream 106 and run for a selected number of clock cycles. The output data 112 is then read from test circuit storage areas in the FPGA and evaluated relative to the objective function. The evaluation produces a score 114, which determines whether the mutated chromosome is used as the base chromosome for the next mutation or the mutation is undone and the previous chromosome is used for the next mutation.

Chromosome 102 is a string of bit values, selected ones of which are mutated to produce mutated chromosome 104. The chromosome is generic, which allows mapping of the structure to many different problem domains. In the example embodiment, the bit values in the mutated chromosome are translated to bit values in configuration bitstream 106 to program various elements in FPGA 110. It will be appreciated that the chromosome structure can be applied to different problem domains by using a suitable mapping function to translate the chromosome to a particular binary object. Therefore, the object evolution techniques described herein could be applied to a variety of problem domains.

Chromosome 102 is iteratively mutated until a suitable configuration bitstream 106 is generated. Initially, random data is generated and stored in chromosome 102. Alternatively, the chromosome may be initialized with a predefined structure. When the chromosome is mutated, the number of bits mutated varies relative to the score, which is an indication of how close the chromosome is to the final solution. Thus, the mutation is coarse in the initial iterations, and the mutation is finer in the final iterations as the chromosome nears a final solution. In other words, the mutation rate varies as a function of the target score and the best score thus far achieved.

In another embodiment, a mutated chromosome having a poorer score than the previous chromosome may or may not be used in the next iteration as determined by a probabilistic function. As the scores of mutated chromosomes near the target score, the probability of accepting a poorer-scoring chromosome is reduced. The process of evolving a solution has been compared to navigating a maze. Just as it may be necessary to occasionally backtrack in the maze, it may be necessary to occasionally consider poorer-scoring chromosomes.

Figure 2:
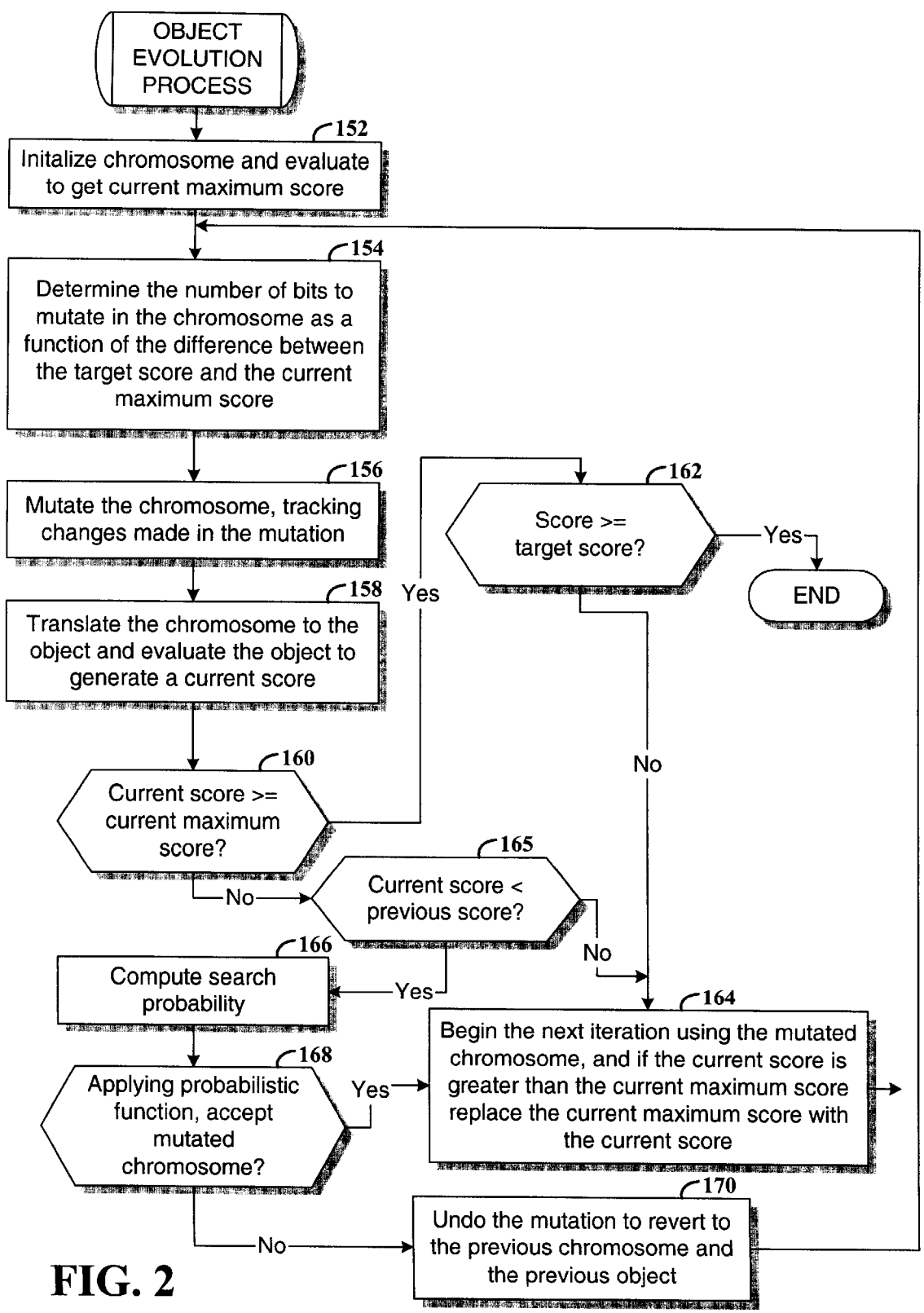
FIG. 2 is a flowchart of a process for evolving an object in accordance with one embodiment of the invention.

FIG. 2 is a flowchart of a process for evolving an object in accordance with one embodiment of the invention. At step 152, a chromosome is initialized, and the chromosome is evaluated to generate a current maximum score. The initial value of the chromosome may depend on the particular application. For example, the chromosome may be initialized with a randomly generated set of bits or a predetermined set of bits. The current maximum score is used to control both the number of bits of a chromosome that are mutated and whether a poorer-scoring chromosome is mutated for the next iteration. At step 154, the number of bits to mutate is determined.

The number of bits to mutate is a function of a user-selected maximum mutation rate and a fraction that reduces from 1 to 0 as the process converges on a solution. The maximum mutation rate is determined from the product of a user-supplied fractional constant and the number of chromosome bits. That is, the user determines the maximum percentage of chromosome bits that can be mutated. The number of bits to mutate is determined as follows:

\# bits to mutate=A * B

A=maximum mutation rate=fraction * #chromosome bits $$B = \frac{(\text{target score} - \text{current maximum score})}{\text{target score}}$$

As the object evolves and the current maximum score increases, the mutation rate is adjusted to finer levels. It will also be appreciated that for larger chromosomes, the mutation rate starts at a greater value, thereby permitting the process to scale well from small problems to large problems.

The example embodiment uses a scoring technique where an object having a greater score more closely approximates a final solution than does an object having a lesser score. However, it will be appreciated that the scoring method could be reversed, such that an object having a lesser score more closely approximates a final solution than an object having a greater score. Still other scoring methods could be adapted for use with the present invention.

At step 156 the chromosome is mutated, with the number of mutating bits having been determined at step 154. The particular bits selected for mutation are selected at random, and the mutation involves setting the bit to a value opposite from the current bit value. Also at step 156, the changes made to the chromosome and/or object are tracked so that the changes can be undone on both the chromosome and object if necessary. It will be appreciated that the manner in which the changes are tracked may depend on the size of the chromosome and the object as well as other factors. For example, for smaller chromosomes it may be desirable to save a copy of the chromosome and/or object prior to mutation. For larger chromosomes, it may be desirable to save only the locations of the mutated bits.

At step 158, the chromosome is translated to the object, and the object is evaluated to produce a current score. In an example application of the invention, the chromosome is translated to a configuration bitstream for an FPGA as described by Delon Levi et al in commonly owned, co-pending U.S. patent application Ser. No. 09/335,862, "METHOD AND APPARATUS FOR EVOLVING CONFIGURATION BITSTREAMS", filed Jun. 17, 1999, which is incorporated herein by reference. The technique used to evaluate the object depends on the problem domain. For example, as described above, a configuration bitstream can be evaluated by configuring an FPGA, testing the circuitry, and comparing output data to some set of expected results.

It will be appreciated that other problem domains would use different evaluation techniques. In the present embodiment, the outcome of the evaluation is a current score that reflects the suitability of the object relative to a desired solution as represented by a target score.

At decision step 160, the current score is compared to the current maximum score. If the current score is greater than or equal to the current maximum score, control is directed to decision step 162 to test whether the current score is equal to the target score. If the current score is greater than or equal to the target score, then the object is a solution to the problem defined by the evaluation criteria. Otherwise, control is directed to step 164.

At step 164, the current mutated chromosome is selected for use as the chromosome to mutate in the next iteration. Furthermore, if the current score is greater than the current maximum score, the current maximum score is replaced with the current score.

Returning to decision step 160, if the current score is less than the current maximum score, control is directed to decision step 165. If the current score is less than the previous score, control is directed to step 166. Steps 166 and 168 apply a probabilistic function to the search probability to determine whether to keep the mutated chromosome with the lesser score. At step 166, the search probability is computed as follows:

Search Probability=C * D

C is the maximum search probability which is a user-specified fraction $$D = \frac{(\text{target score} - \text{current maximum score})}{\text{target score}}$$

At step 168, a probabilistic function is applied to the search probability as follows. First a random number between 0 and 1 is generated using a random number generator as is generally available with many operating systems. If the random number is less than or equal to the search probability, the mutated chromosome is accepted for use in the next iteration (step 164). Otherwise, control is directed to step 170 to undo the mutation, both on the chromosome and on the object.

Figure 3:
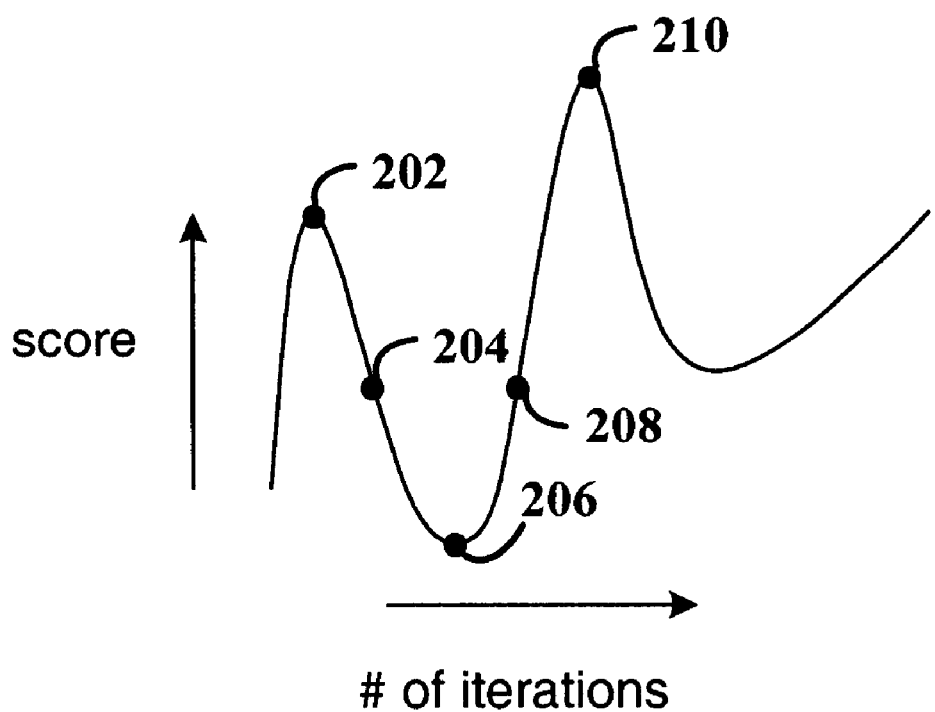
FIG. 3 is a graph that illustrates the scores associated with chromosomes relative to a number of iterations in an example scenario.

FIG. 3 is a graph that illustrates the scores associated with chromosomes relative to a number of iterations in an example scenario where accepting a poorer-performing chromosome leads to a better-performing chromosome. Point 202 represents a stage in the process where a score Y is achieved at iteration X. Because mutations are generated at random, the path leading to a chromosome having a better score cannot be predicted. Therefore, in some instances it may be desirable to use a poorer-scoring chromosome in the next generation.

For example, at point 204 the score is less than score Y from a prior iteration, and at point 206 the score is even less than the score at point 204. However, by accepting poorer-scoring chromosomes at points 204 and 206, the score of the chromosome at point 208 increases relative to point 206. At point 210, the score of the chromosome is greater than the score at point 202. Thus, by using some poorer-performing chromosomes, better-performing chromosomes may be obtained. In the present invention, as the chromosomes converge on a solution, the probability of accepting a poorer-performing chromosome is reduced.

The present invention is believed to be applicable to a variety of problem domains in which evolution-based processing techniques are suitable. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A computer-implemented method for evolving an object over a plurality of iterations, comprising:

mutating an object in each iteration in proportion to a mutation level, whereby a current mutated object is generated;

evaluating in each iteration the current mutated object relative to satisfaction of predetermined criteria, whereby a current satisfaction level is generated;

reducing in each iteration the mutation level as the current satisfaction level approaches a target satisfaction level; and repeating the steps of mutating, evaluating, and reducing the mutation level, using the current mutated object as the object to mutate, until the current satisfaction level achieves the target satisfaction level.

2. The method of claim 1, further comprising:

tracking a best current satisfaction level, wherein the best current satisfaction level is equal to one of the current satisfaction levels from the plurality of iterations that is nearest the target satisfaction level;

using the current mutated object in a subsequent iteration as the object to be mutated if the current satisfaction level is nearer the target satisfaction level than the best current satisfaction level; and selectively using the current mutated object in a subsequent iteration as the object to be mutated if the current satisfaction level is further from the target satisfaction level than the best current satisfaction level.

3. The method of claim 2, further comprising, if the current satisfaction level is further from the target satisfaction level than a satisfaction level from a previous iteration, then establishing a selection probability value and selecting as a function of the probability value the current mutated object for use in the subsequent iteration as the object to be mutated.

4. The method of claim 3, further comprising selecting a previous mutated object from a previous iteration as the object to be mutated if the current mutated object is not selected as a function of the probability value for use as the object to be mutated in the subsequent iteration.

5. The method of claim 4, further comprising establishing the probability value as a function of the best current satisfaction level and the target satisfaction level.

6. The method of claim 1, wherein the object is a configuration bitstream for a programmable logic device.

7. A computer-implemented method for evolving an object over a plurality of iterations, comprising:

mutating an object in each iteration in proportion to a mutation level, whereby a current mutated object is generated;

evaluating in each iteration the current mutated object relative to satisfaction of predetermined criteria, whereby a current score is generated;

reducing in each iteration the mutation level as the current score approaches a target score; and repeating the steps of mutating, evaluating, and reducing the mutation level, using the current mutated object as the object to mutate, until the current score is greater than or equal to the target score.

8. The method of claim 7, further comprising:

tracking a maximum current score, wherein the maximum current score is a greatest one of the current scores from the plurality of iterations;

using the current mutated object in a subsequent iteration as the object to be mutated if the current score is greater than the maximum current score; and selectively using the current mutated object in a subsequent iteration as the object to be mutated if the current score is less than the maximum current score.

9. The method of claim 8, further comprising, if the current score is less than a score from a previous iteration, then establishing a selection probability value and selecting as a function of the probability value the current mutated object for use in the subsequent iteration as the object to be mutated.

10. The method of claim 9, further comprising selecting a previous mutated object from a previous iteration as the object to be mutated if the current mutated object is not selected as a function of the probability value for use as the object to be mutated in the subsequent iteration.

11. The method of claim 10, further comprising establishing the probability value as a function of the maximum current score and the target score.

12. The method of claim 11, further comprising establishing the probability value as a function of:

(target score−maximum current score)/(target score).

13. The method of claim 7, wherein the object is a configuration bitstream for a programmable logic device.

14. A computer-implemented method for evolving an object, comprising:

(a) mutating a chromosome in proportion to a mutation level, whereby a current mutated chromosome is generated;

(b) translating the mutated chromosome to an object;

(c) evaluating the object relative to satisfaction of predetermined criteria, whereby a current score is generated;

(d) reducing the mutation level as the current score approaches a target score;

(e) repeating the steps (a)–(d), using the current mutated chromosome as the chromosome to mutate, until the current score is equal to or greater than the target score.

15. The method of claim 14, further comprising:

tracking a maximum current score, wherein the maximum current score is a greatest one of current scores from the evaluating step;

using the current mutated chromosome in a subsequent iteration as the chromosome to be mutated if the current score is greater than the maximum current score; and selectively using the current mutated chromosome in a subsequent iteration as the chromosome to be mutated if the current score is less than the maximum current score.

16. The method of claim 15, further comprising:

if the current score is less than the maximum current score, then performing steps (f)–(i);

(f) establishing a selection probability value;

(g) obtaining a random number from a random number generator;

(h) selecting the current mutated chromosome for use in a subsequent iteration as the chromosome to be mutated if the random number is less than or equal to the selection probability value; and (i) if the random number is greater than the selection probability value, undoing the mutating step (a) and undoing the translating step (b).

17. The method of claim 16, further comprising establishing the probability value as a function of the maximum current score and the target score.

18. The method of claim 17, further comprising establishing the probability value as a function of:

(target score−maximum current score)/(target score).

19. The method of claim 14, wherein the object is a configuration bitstream for a programmable logic device.

20. An apparatus for evolving an object over a plurality of iterations, comprising:

means for mutating an object in each iteration in proportion to a mutation level, whereby a current mutated object is generated;

means for evaluating in each iteration the mutated object relative to satisfaction of predetermined criteria, whereby a current satisfaction level is generated;

means for reducing in each iteration the mutation level as the current satisfaction level approaches a target satisfaction level; and means for repeating the steps of mutating, evaluating, and reducing the mutation level, using the current mutated object as the object to mutate, until the current satisfaction level achieves the target satisfaction level.

21. The apparatus of claim 20, further comprising:

means for tracking a best current satisfaction level, wherein the best current satisfaction level is equal to one of the current satisfaction levels from the plurality of iterations that is nearest the target satisfaction level;

means for using the current mutated object in a subsequent iteration as the object to be mutated if the current satisfaction level is nearer the target satisfaction level than the best current satisfaction level; and means for selectively using the current mutated object in a subsequent iteration as the object to be mutated if the current satisfaction level is further from the target satisfaction level than the best current satisfaction level.

* * * * *